United States Patent
Kim et al.

(10) Patent No.: US 10,103,295 B2
(45) Date of Patent: Oct. 16, 2018

(54) MANUFACTURING METHOD OF LIGHT EMITTING DEVICE PACKAGE

(71) Applicant: LG INNOTEK CO., LTD., Seoul (KR)

(72) Inventors: Myung Hee Kim, Seoul (KR); Jung Yeop Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/551,465

(22) PCT Filed: Feb. 16, 2016

(86) PCT No.: PCT/KR2016/001553
§ 371 (c)(1),
(2) Date: Aug. 16, 2017

(87) PCT Pub. No.: WO2016/133337
PCT Pub. Date: Aug. 25, 2016

(65) Prior Publication Data
US 2018/0040763 A1  Feb. 8, 2018

(30) Foreign Application Priority Data

Feb. 16, 2015 (KR) .................. 10-2015-0023280

(51) Int. Cl.
H01L 33/52 (2010.01)
H01L 33/00 (2010.01)
H01L 33/50 (2010.01)

(52) U.S. Cl.
CPC ............ H01L 33/52 (2013.01); H01L 33/005 (2013.01); H01L 33/502 (2013.01)

(58) Field of Classification Search
CPC .............................. H01L 33/502; H01L 33/52
See application file for complete search history.

(56) References Cited

U.S. PATENT DOCUMENTS

| | | | |
|---|---|---|---|
| 2005/0006651 A1* | 1/2005 | LeBoeuf | ............... H01L 33/502 257/79 |
| 2010/0200740 A1 | 8/2010 | Ino et al. | |
| 2016/0211245 A1 | 7/2016 | Do | |

FOREIGN PATENT DOCUMENTS

| | | |
|---|---|---|
| JP | 2003-8073 A | 1/2003 |
| JP | 2008-112908 A | 5/2008 |

(Continued)

OTHER PUBLICATIONS

Scheirs, John, Modern Fluoropolymers, John Wiley & Sons Ltd, 1997.*

(Continued)

*Primary Examiner* — Fei Fei Yeung Lopez
(74) *Attorney, Agent, or Firm* — Birch, Stewart, Kolasch & Birch, LLP

(57) ABSTRACT

An embodiment relates to a light emitting device package and a manufacturing method of the light emitting device package. The light emitting device package according to an embodiment may include a body having a top opened cavity, a light emitting device mounted on an inner bottom surface of the cavity, and a molding part accommodated in the cavity to protect the light emitting device, and the molding part may include a CYTOP, and thus not only light efficiency can be enhanced but also the reliability of the product can be improved with high durability.

20 Claims, 6 Drawing Sheets

(56) References Cited

FOREIGN PATENT DOCUMENTS

| | | |
|---|---|---|
| JP | 2008-308510 A | 12/2008 |
| JP | 2010-123769 A | 6/2010 |
| JP | 5103675 B2 | 12/2012 |
| KR | 10-1436123 B1 | 11/2014 |

OTHER PUBLICATIONS

International Search Report, issued in PCT/KR2016/001553, dated May 27, 2016.

* cited by examiner

[Fig. 1]
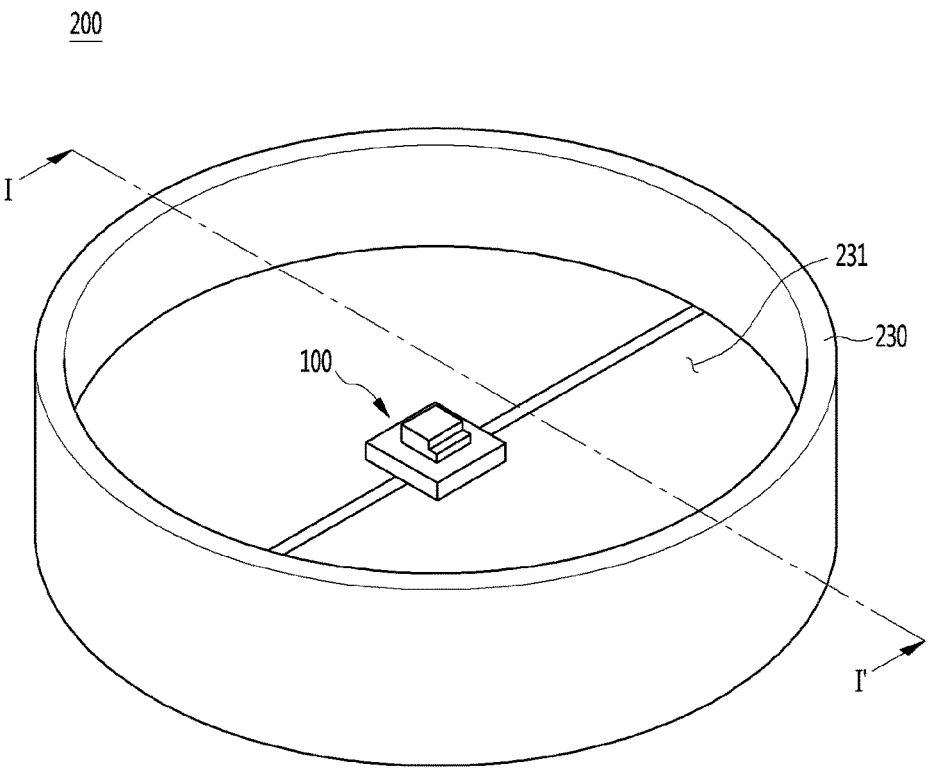
[Fig. 2]
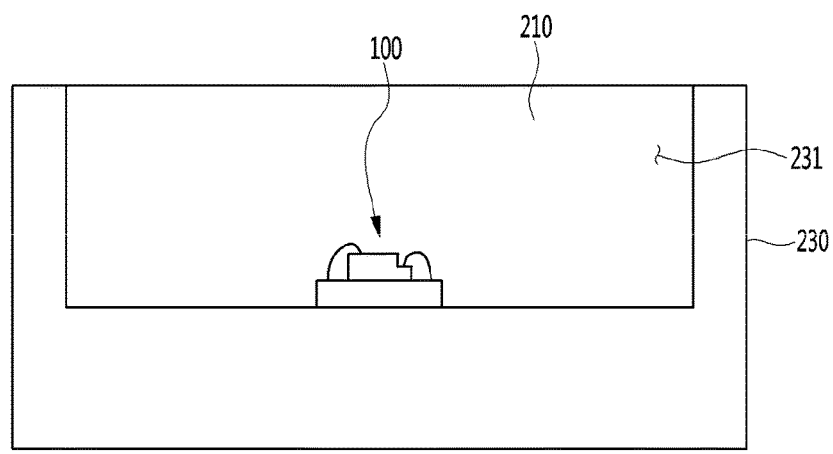

[Fig. 3]
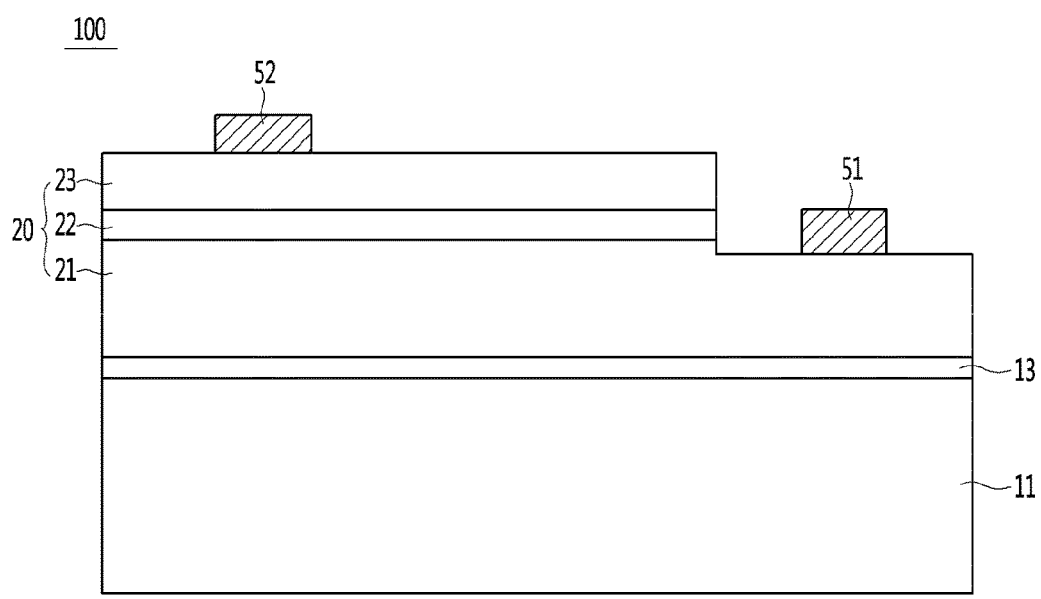

[Fig. 4]
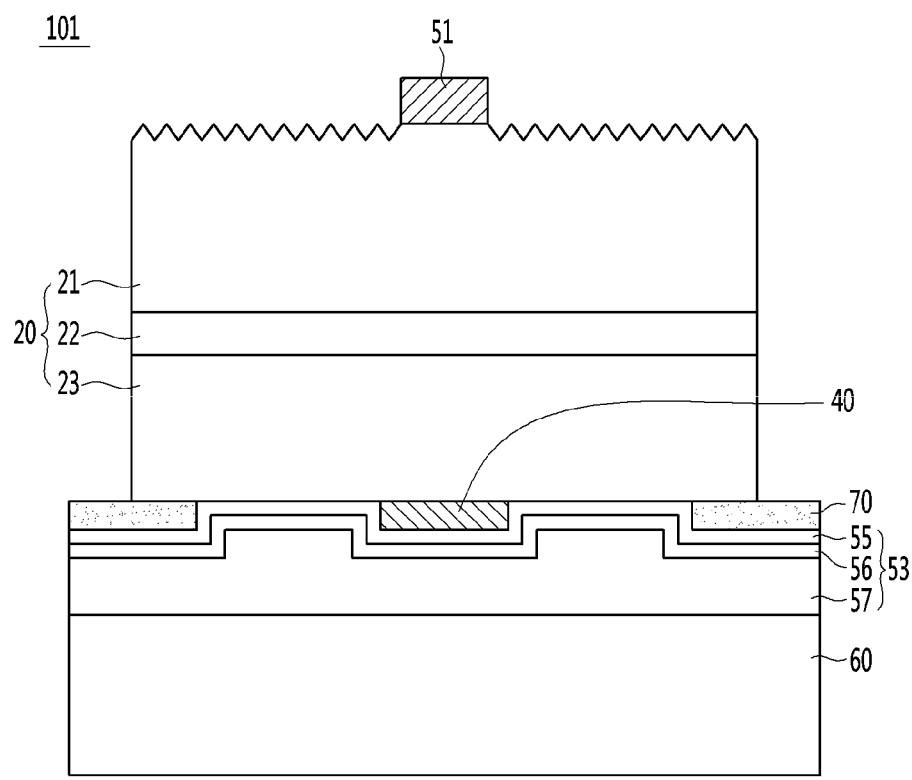

[Fig. 5]
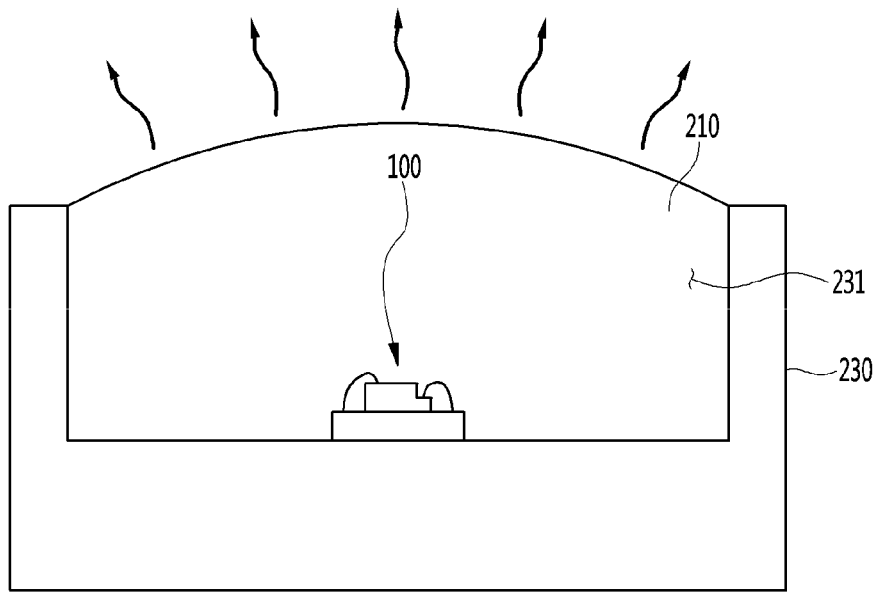
[Fig. 6]
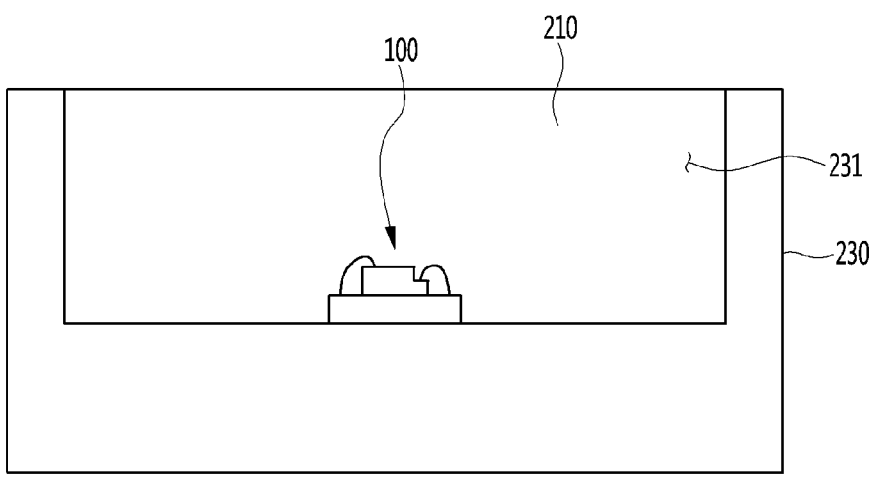

[Fig. 7]
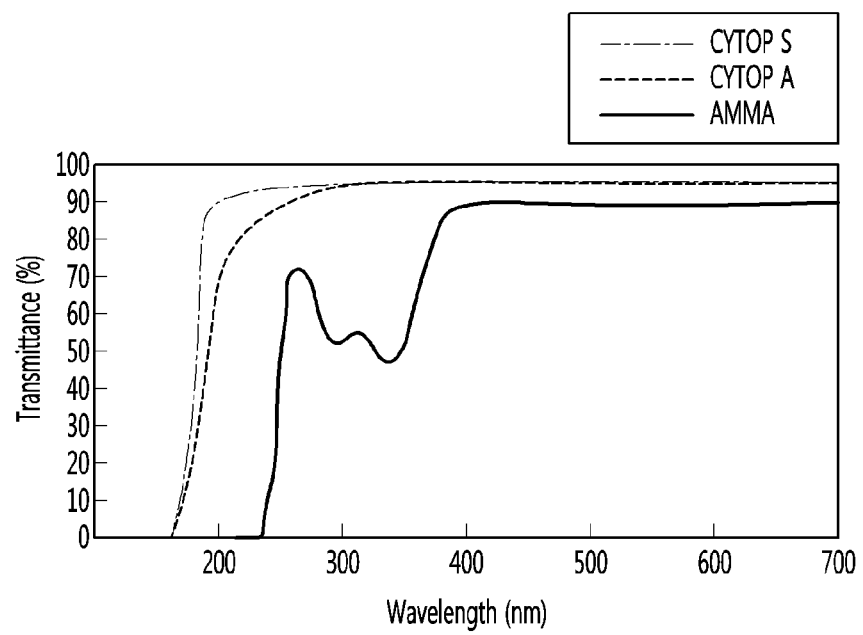
[Fig. 8]
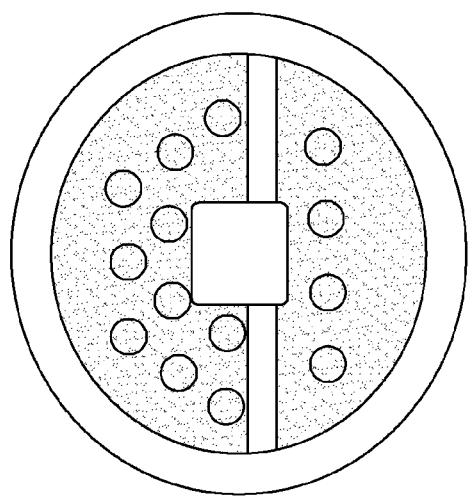

[Fig. 9]
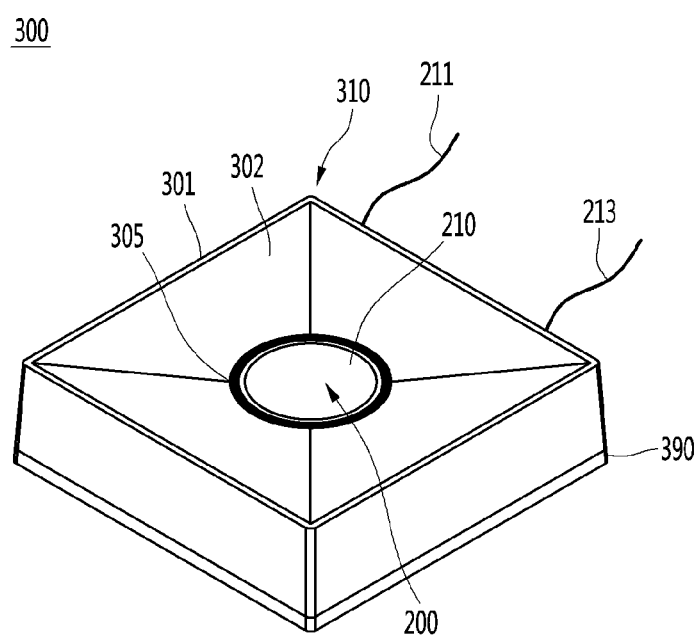

MANUFACTURING METHOD OF LIGHT EMITTING DEVICE PACKAGE

CROSS REFERENCE TO RELATED APPLICATIONS

This application is the National Phase of PCT International Application No. PCT/KR2016/001553, filed on Feb. 16, 2016, which claims priority under 35 U.S.C. 119(a) to Patent Application No. 10-2015-0023280, filed in the Republic of Korea on Feb. 16, 2015, all of which are hereby expressly incorporated by reference into the present application.

TECHNICAL FIELD

The embodiment relates to a light emitting device package, a manufacturing method of the light emitting device package, and a light source unit.

BACKGROUND ART

A light emitting device is a p-n junction diode having characteristics of converting electric energy into light energy, may be configured with a compound semiconductor of Group III and Group V elements or the like of the periodic table and may represent various colors by adjusting a composition ratio of a compound semiconductor.

GaN-based light emitting device (LED) has been used for various applications such as a natural color LED display device, a LED traffic signal, and white LED. Recently, luminous efficiency of a high-efficiency white LED is more excellent than that of a conventional fluorescent lamp, and is expected to replace a fluorescent lamp in a general illumination field.

A light emitting device having a general ultraviolet wavelength mounts an ultraviolet light emitting device in a cavity of a body, and covers a quartz film which protects the light emitting device and transmits an ultraviolet wavelength. The quartz film is bonded to the body using an adhesive.

However, in the light emitting device having a general ultraviolet wavelength, there is a problem that poor bonding between the body and the quartz film is caused by adhesive damage along the edge of the quartz film by a photon of the ultraviolet wavelength from the light emitting device.

DISCLOSURE

Technical Problem

The embodiment provides a light emitting device package which may simplify a structure, a manufacturing method of the light emitting device package, and a light source unit.

The embodiment provides a light emitting device package which may simplify a manufacturing process, a manufacturing method of the light emitting device package, and a light source unit.

The embodiment provides a light emitting device package which may realize high transmittance and be excellent moisture proofing simultaneously, a manufacturing method of the light emitting device package, and a light source unit.

The embodiment provides a light emitting device package which may improve reliability, a manufacturing method of the light emitting device package, and a light source unit.

Technical Solution

A light emitting device package according to an embodiment may include a body having a top opened cavity; a light emitting device mounted on an inner bottom surface of the cavity; and a molding part accommodated in the cavity to protect the light emitting device, and the molding part may include a CYTOP.

A manufacturing method of a light emitting device package according to the embodiment may include: mounting a light emitting device on a bottom surface of a cavity of a body having a top opened cavity; depositing a CYTOP of a CF-based fluororesin on the light emitting device; and drying the CYTOP at a low temperature of 20° C. or less.

A light source unit according to the embodiment may include the light emitting device package.

Advantageous Effects

In a light emitting device package according to an embodiment, a molding part including a CYTOP transmitting at least 90% of an ultraviolet wavelength is formed on a light emitting device, and thus not only light efficiency can be enhanced but also reliability of the product can be improved with high durability.

In the light emitting device package according to the embodiment, the molding part including the CYTOP is formed on the light emitting device, thereby preventing the reliability degradation by adhesive damage of a general light emitting device package including a quartz film and an adhesive and thus a yield can be improved.

In addition, in the light emitting device package according to the embodiment, an expensive quartz film is eliminated, and thus a manufacturing cost of the light emitting device package can be reduced.

The light emitting device package of the embodiment comprises the molding part including the CYTOP, thereby being excellent in adhesion to the light emitting device and components in contact with a body and the like, and thus it is advantageous in moisture proofing.

In addition, the light emitting device package of the embodiment comprises the molding part including the CYTOP, thereby being excellent in a moisture-proofing function, having a chemical resistance strong against chemical substances, and reducing a manufacturing cost by a simplified structure and a manufacturing method, and thus a yield can be improved.

DESCRIPTION OF DRAWINGS

FIG. 1 is a perspective view illustrating a light emitting device package according to an embodiment.

FIG. 2 is a cross-sectional view illustrating the light emitting device package taken along line I-I' of FIG. 1

FIG. 3 is a cross-sectional view illustrating a light emitting device of FIG. 1 according to an embodiment.

FIG. 4 is a cross-sectional view illustrating a light emitting device according to another embodiment.

FIGS. 5 and 6 are views illustrating a manufacturing method of a light emitting device package according to an embodiment.

FIG. 7 is a graph illustrating an ultraviolet light transmittance of a molding part according to an embodiment and a general PMMA resin.

FIG. 8 is a view illustrating a light emitting device package according to an embodiment.

FIG. 9 is a perspective view illustrating a light source unit including a light emitting device package according to an embodiment.

MODES OF THE INVENTION

Hereinafter, a light emitting device package according to an embodiment will be described with reference to the accompanying drawings. In the description of embodiments, it will be understood that when a layer (or film), region, pattern or structure is referred to as being "on" or "under" another layer (or film), region, pattern or structure, the terminology of "on" and "under" comprises both the meanings of "directly" or "by interposing another layer (indirectly)". Further, the reference about "on" and "under" each layer will be made on the basis of drawings.

FIG. 1 is a perspective view illustrating a light emitting device package according to an embodiment, FIG. 2 is a cross-sectional view illustrating the light emitting device package taken along line I-I' of FIG. 1, and FIG. 3 is a cross-sectional view illustrating a light emitting device of FIG. 1 according to the embodiment.

Referring to FIGS. 1 to 3, a light emitting device package 200 according to the embodiment comprises a body 230, a light emitting device 100, and a molding part 210.

The light emitting device 100 may emit an ultraviolet wavelength, that is, an ultraviolet wavelength in the range of 300 nm or less. More specifically, the light emitting device 100 may emit an ultraviolet wavelength in the range of 100 nm to 280 nm. The wavelength of the light emitting device 100 is not limited thereto, and the light emitting device 100 may emit at least one wavelength of visible light or infrared light.

The light emitting device 100 may be mounted on a subframe 110, and the subframe 110 may be in direct contact with the body 230. The subframe 100 may include a heat-radiating function and may include a pad function by being connected to electrodes of the light emitting device 100.

Although not shown in the drawings, the light emitting device 100 may be electrically connected to the body 230 through at least one wire depending on a type of the light emitting device 100. The light emitting device 100 of the embodiment is a horizontal type and may be connected to an electrode pad of the subframe 100 or a lead electrode of the body 230 through at least two wires.

The light emitting device 100 is the horizontal type and comprises a substrate 11, a buffer layer 13, a light emitting structure 20, first and second electrodes 51 and 53.

The substrate 11 may use a light-transmitting, insulating, or conductive substrate as a growth substrate on which a gallium nitride-based semiconductor layer may be grown. For example, any one of sapphire ($Al_2O_3$), SiC, Si, GaAs, GaN, ZnO, Si, GaP, InP, Ge, $Ga_2O_3$, $LiGaO_3$, and quartz may be used. A plurality of protrusion portions may be formed on an upper surface of the substrate 11, and the plurality of protrusion portions may be formed by etching of the substrate 11 or may be formed in a light extraction structure such as separate roughness.

The protrusion portion may include a stripe shape, a hemispherical shape, or a dome shape. The buffer layer 13 may be formed on the substrate 11 to mitigate the difference in lattice constant between the substrate 11 and a nitride-based semiconductor layer, and may function as a defect control layer.

The buffer layer 13 may have a value between lattice constants between the substrate 11 and the nitride-based semiconductor layer. The buffer layer 13 may be formed of an oxide such as a ZnO layer, and is not limited thereto.

The light emitting structure 20 is disposed on the substrate 11. The light emitting structure 20 comprises a first conductive semiconductor layer 21, an active layer 22, and a second conductive semiconductor layer 23.

The first conductive semiconductor layer 21 may be forming as a single layer or a multilayer. When the first conductive semiconductor layer 21 is an n-type semiconductor layer, the first conductive semiconductor layer 21 may be a compound semiconductor of Group III and V elements doped with a first conductive dopant. The first conductive dopant may include Si, Ge, Sn, Se, and Te as an n-type dopant, but is not limited thereto. The first conductive semiconductor layer 21 may include a semiconductor substance having a composition formula, $In_xAl_yGa_{1-x-y}N$ ($0 \le x \le 1$, $0 \le y \le 1$, $0 \le x+y \le 1$). The first conductive semiconductor layer 21 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 22 may be one of a single quantum well structure, a multi quantum well (MQW) structure, a quantum-wire structure, and a quantum dot structure. The active layer 22 may include a well layer and a barrier layer formed of a gallium nitride-based semiconductor layer.

For example, the active layer 22 may include one or more of a pair structure of InGaN/GaN, InGaN/InGaN, GaN/AlGaN, InAlGaN/GaN, GaAs/AlGaAs, InGaAs/AlGaAs, GaInP/AlGaInP, GaP/AlGaP, and InGaP/AlGaP, but is not limited thereto. The well layer may be formed of a substance having a lower band gap than that of the barrier layer.

In order to improve the crystal quality of the active layer, the barrier layer and the well layer of the active layer 22 may be formed of a undoped layer which is not doped with impurities. However, in order to lower a forward voltage, impurities may be doped into some or all of active regions.

The second conductive semiconductor layer 23 may be formed on the active layer 22 and may be a single layer or a multi-layer. When the second conductive semiconductor layer 23 is a p-type semiconductor layer, the second conductive semiconductor layer 23 may be a compound semiconductor of Group III and V elements doped with a second conductive dopant. The second conductive dopant may include Mg, Zn, Ca, Sr, Ba, or the like as a p-type dopant, but is not limited thereto. For example, the second conductive semiconductor layer 23 may include one of compound semiconductors such as GaN, AlN, AlGaN, InGaN, InN, InAlGaN, AlInN, AlGaAs, GaP, GaAs, GaAsP, AlGaInP, and GaP.

The first electrode 51 may be disposed on the first conductive semiconductor layer 21.

The second electrode 53 may be disposed on the second conductive semiconductor layer 23.

The first electrode 51 and the second electrode 53 may be selected from Ti, Ru, Rh, Ir, Mg, Zn, Al, In, Ta, Pd, Co, Ni, Si, Ge, Ag and Au, and selective alloys among those.

The body 230 comprises a top opened cavity 231 and the light emitting device 100 may be mounted on a bottom surface of the cavity 231.

The body 230 may be formed with a stacked structure of a plurality of insulating layers.

The material of the body 230 may be $SiO_2$, $Si_xO_y$, $Si_3N_4$, $Si_xN_y$, $SiO_xN_y$, $Al_2O_3$, or AlN, and may include a stacked structure of a plurality of ceramic layers.

Although not shown in the drawing, when the body 230 is formed of an electrically conductive material, the body 230 may include an insulating layer on the surface.

The insulating layer may prevent a short between different electrodes of the light emitting device 100.

The body 230 may include a plurality of lead electrodes (not shown).

The lead electrode may be formed of a metal containing at least one of titanium (Ti), copper (Cu), nickel (Ni), gold (Au), and the like. In addition, the plurality of lead electrodes may be selectively formed using a plating method, a deposition method, a photolithography method, or the like, and is not limited thereto.

The molding part 210 may include a CYTOP of a CF-based fluororesin. The molding part 210 uses the CYTOP capable of molding the cavity 231 without a heating process, thereby simplifying the manufacturing process.

The molding part 210 may include an amorphous structure. The molding part 210 may include the CYTOP of the amorphous structure and may have a transmittance of the ultraviolet wavelength including visible light at 90% or more. The molding part 210 may be dissolved using a special fluorine-based solvent, and a thin film may be coated.

The CYTOP of the amorphous structure is excellent in adhesion to various substances such as the light emitting device 100 and the body 230, and the like, has an excellent moisture-proofing function, has a chemical resistance strong against a chemical substance, and thus not only a manufacturing cost may be reduced by a simplified manufacturing process but also reliability may be improved by improving damage caused by the ultraviolet wavelength.

The molding part 210 may or may not include a functional group. For example, the molding part 210 may include an A-type or M-type CYTOP containing a functional group binding to an oxygen group, or an S-type CYTOP not containing the functional group.

Here, since the S-type CYTOP does not contain a functional group, the A-type CYTOP may be used as a binder.

The light emitting device package 200 of the embodiment is formed with the molding part 210 including the CYTOP which transmits at least 90% of the ultraviolet wavelength on the light emitting device 100 to prevent reliability degradation from adhesive damage, and thus a yield can be improved.

The light emitting device package 200 of the embodiment comprises the molding part 210 including the CYTOP, thereby being excellent in adhesion to the light emitting device 100 and the body 230, and thus it is advantageous in moisture proofing.

In addition, the light emitting device package 200 of the embodiment comprises the molding part 210 including CYTOP, thereby being excellent in the moisture-proofing function.

In addition, the light emitting device package 200 of the embodiment may include the molding part 210 including the CYTOP, and thus the light emitting device package 200 may have strong chemical resistance to a chemical substance.

In addition, the light emitting device package 200 of the embodiment may include the molding part 210 including the CYTOP, thereby reducing a manufacturing cost by a simplified structure and manufacturing method, and thus a yield can be improved.

FIG. 4 is a cross-sectional view illustrating a light emitting device according to another embodiment.

Referring to FIG. 4, a light emitting device 101 of another embodiment comprises a light emitting structure 20 in a vertical type, a first electrode 51 disposed on the light emitting structure 20, a second electrode 53 disposed under the light emitting structure 20, a current blocking layer 40 disposed between the light emitting structure 20 and the second electrode 53 and vertically aligned with the first electrode 51, and a support member 60.

The light emitting structure 20 is disposed on a substrate 11. The light emitting structure 20 comprises a first conductive semiconductor layer 21, an active layer 22, and a second conductive semiconductor layer 23.

The second electrode 53 may include a contact layer 55, a reflective layer 56, and a bonding layer 57 disposed under the second conductive semiconductor layer 23 of the light emitting structure 20.

The contact layer 55 may be in contact with a lower surface of the second conductive semiconductor layer 23, and a part of the contact layer 55 may extend to a lower surface of the current blocking layer 40. The contact layer 55 may be formed of a conductive substance such as ITO, IZO, IZTO, IAZO, IGZO, IGTO, AZO, and ATO, or a metal such as Ni and Ag.

The reflective layer 56 may be formed under the contact layer 55, and the reflective layer 56 may be formed of a structure including at least one layer formed of a substance selected from the group consisting of Ag, Ni, Al, Rh, Pd, Ir, Ru, Mg, Zn, Pt, Au, Hf, or a combination thereof. The reflective layer 56 may be in contact with a bottom of the second conductive semiconductor layer 23, and may be in ohmic contact with a metal or ohmic contact with a conductive material such as ITO, and is not limited thereto.

The bonding layer 57 may be formed under the reflective layer 56, and the bonding layer 57 may be used as a barrier metal or a bonding metal. For example, the substance may include at least one of Ti, W, WTi, Au, Sn, Ni, Cr, Ga, In, Bi, Cu, Ag and Ta, and a selective alloy.

A channel layer 70 may be disposed under the light emitting structure 20. The channel layer 70 is formed along an edge of the lower surface of the second conductive semiconductor layer 23 and may be formed in a ring shape, a loop shape, or a frame shape. The channel layer 70 may include at least one of ITO, IZO, IZTO, IAZO, IGZO, IGTO, AZO, ATO, $SiO_2$, $SiO_x$, $SiO_xN_y$, $Si_3N_4$, $Al_2O_3$ and $TiO_2$ An inner portion of the channel layer 70 may be disposed under the second conductive semiconductor layer 23, and an outer portion thereof may be disposed further outward than a side surface of the light emitting structure 20.

The support member 60 is formed under the bonding layer 57. The support member 60 may be formed of a conductive member, and the substance may be formed of a conductive substance such as copper (Cu), gold (Au), nickel (Ni), molybdenum (Mo), copper-tungsten (Cu—W), and a carrier wafer (for example: Si, Ge, GaAs, ZnO, or the like).

As another example, the support member 60 may be formed of a conductive sheet. The second electrode pad 53 may include the support member 60 and at least one or a plurality of layers of the second electrode pad 53 may be formed to have the same width as that of the support member 60.

A light extraction structure such as a roughness may be formed on an upper surface of the first conductive semiconductor layer 21. The first electrode pad 51 may be disposed on a flat surface of the upper surface of the first conductive semiconductor layer 21, but is not limited thereto. An insulating layer (not shown) may be further formed on the side surfaces and the upper surface of the light emitting structure 20, and is not limited thereto.

The current blocking layer 40 overlaps the first electrode pad 51 and has a function of preventing a current from concentrating on a lower portion of the second electrode pad 53.

For example, the current blocking layer 40 may be formed of an insulating material such as an oxide or a nitride. For example, the current blocking layer 40 may be formed of at least one selected from the group consisting of $Si_xO_y$, $Si_xN_y$, $SiO_xN_y$, $Al_2O_3$, $TiO_2$, and AlN, but is not limited thereto. Alternatively, the current blocking layer 40 may include a distributed Bragg reflector (DBR) in which layers having different refractive indices are alternately stacked, but is not limited thereto.

The light emitting devices 100 and 101 of FIGS. 3 and 4 are described with respect to the horizontal and vertical types, but is not limited thereto, and a flip type in which the electrode pads are disposed only at the bottom may be included.

FIGS. 5 and 6 are views illustrating a manufacturing method of a light emitting device package according to an embodiment.

Referring to FIGS. 5 and 6, the light emitting device package 200 according to the embodiment comprises the light emitting device 100 mounted on the cavity 231 of the body 230, and a deposition process of the molding part 210 including the CYTOP of the CF-based fluororesin is performed on the cavity 231.

Here, the CYTOP may be the A-type CYTOP having a functional group binding to an oxygen group or the S-type CYTOP not containing the functional group. Since the S-type CYTOP does not contain the functional group, the A-type CYTOP may be used as a binder.

A manufacturing method of a light emitting device package describes the A-type CYTOP as an embodiment.

The molding part 210 deposits the A-type CYTOP containing a functional group binding to an oxygen group in the cavity 231 at a temperature of 0° C. to 20° C. For example, the molding part 210 may be deposited at a temperature of 5° C. The molding part 210 is deposited on the cavity 231, and then the topmost film may be removed.

Then, the molding part 210 is subjected to a drying process at a temperature of 0° C. to 20° C. for 12 to 36 hours. For example, the molding part 210 deposits the A-type CYTOP in the cavity 231 and is subjected to a first drying process at a temperature of 5° C. for 24 hours. Accordingly, the A-type CYTOP may slowly dry the solvent at a low temperature of 20° C. or lower for 12 hours or longer.

The first drying process is performed at a low temperature, and a second drying process is performed at a temperature of 100° C. or higher for 1 hour or more. For example, the second process may be performed at 200° C. or higher for 2 hours.

Referring to FIG. 6, the molding part 210 may be formed as a film type on the light emitting device 100 by removing the solvent in the first and second drying processes.

The molding part 210 may have a cross-sectional structure having a flat-upper surface on the light emitting device 100, but is not limited thereto. For example, the molding part 210 may have a convex or concave cross-sectional structure.

In the manufacturing method of a light emitting device package according to the embodiment, the molding part 210 formed by the first and second drying processes of the CYTOP which transmits at least 90% of the ultraviolet wavelength is formed on the light emitting device 100, and thus not only a light efficiency may be enhanced but also a reliability of a product may be improved with high durability.

In the light emitting device package according to the embodiment, the molding part 210 including the CYTOP may be formed on the light emitting device 100, thereby preventing the reliability degradation by adhesive damage of a general light emitting device package including a quartz film and an adhesive, and thus a yield may be improved.

In addition, the light emitting device package according to the embodiment eliminates the expensive quartz film, and thus a manufacturing cost of the light emitting device package can be reduced.

The light emitting device package of the embodiment comprises the molding part 210 including the CYTOP, thereby being excellent in adhesion to the light emitting device and components in contact with the body and the like, and thus it is advantageous in moisture proofing.

In addition, the light emitting device package of the embodiment comprises the molding part 210 including the CYTOP, thereby being excellent in the moisture-proofing function, having chemical resistance strong against chemical substances, and reducing a manufacturing cost by the simplified structure and the manufacturing method, and thus a yield can be improved.

FIG. 7 is a graph illustrating an ultraviolet light transmittance of a molding part according to an embodiment and a general PMMA resin, and FIG. 8 is a view illustrating a light emitting device package according to an embodiment.

Comparing the light transmittances of the A-type CYTOP of a 200 μm thickness, the S-type CYTOP of a 200 μm thickness, and the PMMA of a 200 μm thickness, the light emitting device package according to the embodiment is the A-type CYTOP, and the S-type CYTOP has a high transmittance of 90% or more at the ultraviolet wavelength in the range of 100 nm to 280 nm.

In the light emitting device package according to the embodiment, damage or thermal degradation is not found in the molding part of the CYTOP under the conditions of a temperature of 5° C., a driving of 60 mA, and the time of 100 hours.

In the light emitting device package according to the embodiment, the molding part including the CYTOP transmitting at least 90% of the ultraviolet wavelength is formed on the light emitting device, and thus not only the light efficiency may be improved but also the reliability of the product can be improved with high durability.

In the light emitting device package according to the embodiment, the molding part including the CYTOP may be formed on the light emitting device, thereby preventing the reliability degradation by the adhesive damage of the general light emitting device package including the quartz film and the adhesive, and thus a yield can be improved.

In addition, the light emitting device package according to the embodiment eliminates the expensive quartz film, and thus a manufacturing cost of the light emitting device package can be reduced.

The light emitting device package of the embodiment comprises the molding part including the CYTOP, thereby being excellent in adhesion to the light emitting device and the components in contact with the body and the like, and thus it is advantageous in moisture proofing.

In addition, the light emitting device package of the embodiment comprises the molding part including the CYTOP, thereby being excellent in the moisture-proofing function, having a chemical resistance strong against chemical substances, and reducing a manufacturing cost by the simplified structure and the manufacturing method, and thus a yield can be improved.

FIG. 9 is a perspective view illustrating a light source unit including a light emitting device package according to an embodiment.

Referring to FIG. 9, a light source unit 300 comprises a light emitting device package 200 according to the embodiment, a first cover 310 having an open region 305 through which light emitted from the light emitting device package 200 is emitted and covering the light emitting device package 200, a second cover 390 coupled to the first cover 310, and a resin in the first cover 310 and the second cover 390.

The light source unit 300 seals the light emitting device package 200 in the first and second covers 310 and 390, and draws out signal cables 211 and 213 connected to the light emitting device package 200 and supplies power to the light emitting device package 200. The light emitting device of the light emitting device package 200 may selectively emit a wavelength within the range of an ultraviolet light to a visible light, and for example, the ultraviolet light may be emitted. The ultraviolet light may include a UV-C wavelength.

The first and second covers 310 and 390 may be formed at least one of glass, plastic, polypropylene (PP), polyethylene (PE), polycarbonate (PC), polybutylene terephthalate (PBT), polyoxymethylene (POM, polyacetal), polyphenylene oxide (PPO) resin, and modified PPO resin.

Here, the modified PPO resin comprises a resin in which the PPO is mixed with a resin such as polystyrene (PS) or polyamide (PA) series, and has heat resistance and maintains physical properties stably even at a low temperature. As another example, the second cover 390 may be formed of metal, and is not limited thereto.

An outer shape of the first and second covers 310 and 390 may be a polygonal shape or a circular shape seen from the top and is not limited thereto.

The first cover 310 comprises a recess portion 302 having the open region 305.

The recess portion 302 is recessed below an upper surface 301 of the first cover 310. A bottom surface of the recess portion 302 may include a sloped surface from the upper surface 301 of the first cover 310 to the open region 305 or may include a curved surface having a predetermined curvature. The bottom surface of the recess portion 302 may include surfaces having corner portions having a predetermined curvature. The recess portion 302 has a gradually lower depth toward a center portion.

As another example, an entire area of the upper surface of the first cover 310 may be a flat surface, and is not limited thereto. As another example, an optical lens (not shown) may be disposed on the open region 305 of the first cover 310, and the material of the optical lens may include glass, silicone, or epoxy.

The open region 305 may be disposed at the bottom center of the recess portion 302. In the open region 305, light emitting devices of the light emitting device package 200 coupled between the first and second covers 310 and 390 are disposed. An upper portion of the light emitting device of the light emitting device package 200 may protrude through the open region 305. The molding part 210 including the CYTOP covering the upper surface and the side surface of the light emitting device 100 may be exposed in the open region 305 without directly exposing the surface of the light emitting device. A width or an area of the open region 305 may be larger than the width or the top surface area of the light emitting device, and is not limited thereto.

The outer shape of the open region 305 may include the same shape as that of the light emitting device. The outer shape of the open region 305 may include a circular shape or a polygonal shape, and is not limited thereto.

The molding part 210 and a sidewall of the open region 305 may be in contact with each other or may be spaced apart at a regular interval. When the molding part 210 and the sidewall of the open region 305 are in contact with each other, a moisture-proofing effect can be improved.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that contents related to such a combination and such a variation are included in the scope of the present invention.

Embodiments are mostly described above. However, they are only examples and do not limit the present invention. A person skilled in the art may appreciate that several variations and applications not presented above may be made without departing from the essential characteristic of embodiments. For example, each component particularly represented in embodiments may be varied. In addition, it should be construed that differences related to such a variation and such an application are included in the scope of the present invention defined in the following claims.

The invention claimed is:

1. A manufacturing method of a light emitting device package, comprising:
   mounting a light emitting device on a bottom surface of a cavity of a body having a top opened cavity;
   forming a CF-based fluororesin on the light emitting device; and
   drying the CF-based fluororesin at a temperature of 20° C. or less,
   wherein the forming the CF-based fluororesin is performed at a temperature of 0° C. to 20° C.

2. The manufacturing method of claim 1, wherein the CF-based fluororesin comprises a functional group binding to an oxygen group.

3. The manufacturing method of claim 1, wherein the CF-based fluororesin does not comprise a functional group.

4. The manufacturing method of claim 1, wherein the forming the CF-based fluororesin is performed at a temperature of 5° C.

5. The manufacturing method of claim 1, wherein the drying the CF-based fluororesin is performed at a temperature of 0° C. to 20° C. for 12 to 36 hours.

6. The manufacturing method of claim 1, wherein the drying the CF-based fluororesin is performed at a temperature of 5° C. for 24 hours.

7. The manufacturing method of claim 1, further comprising drying at a temperature of 100° C. or more for 1 hour or more after the drying the CF-based fluororesin.

8. The manufacturing method of claim 1, further comprising drying at a temperature of 200° C. for 2 hours after the drying the CF-based fluororesin.

9. A manufacturing method of a light emitting device package, comprising:
   mounting a light emitting device on a bottom surface of a cavity of a body having a top opened cavity;
   forming a CF-based fluororesin on the light emitting device; and
   drying the CF-based fluororesin at a temperature of 20° C. or less,
   wherein the drying the CF-based fluororesin is performed at a temperature of 5° C. for 24 hours.

10. The manufacturing method of claim 9, wherein the CF-based fluororesin comprises a functional group binding to an oxygen group.

11. The manufacturing method of claim 9, wherein the CF-based fluororesin does not comprise a functional group.

12. The manufacturing method of claim 11, wherein the forming the CF-based fluororesin is performed at a temperature of 0° C. to 20° C.

13. The manufacturing method of claim 11, wherein the forming the CF-based fluororesin is performed at a temperature of 5° C.

14. The manufacturing method of claim 9, further comprising drying at a temperature of 100° C. or more for 1 hour or more after the drying the CF-based fluororesin.

15. The manufacturing method of claim 9, further comprising drying at a temperature of 200° C. for 2 hours after the drying the CF-based fluororesin.

16. A manufacturing method of a light emitting device package, comprising:
    mounting a light emitting device on a bottom surface of a cavity of a body having a top opened cavity;
    forming a CF-based fluororesin on the light emitting device;
    drying the CF-based fluororesin at a temperature of 20° C. or less; and
    drying at a temperature of 100° C. or more for 1 hour or more after the drying the CF-based fluororesin.

17. The manufacturing method of claim 16, wherein the CF-based fluororesin comprises a functional group binding to an oxygen group.

18. The manufacturing method of claim 16, wherein the CF-based fluororesin does not comprise a functional group.

19. The manufacturing method of claim 16, wherein the forming the CF-based fluororesin is performed at a temperature of 0° C. to 20° C., and
    wherein the drying the CF-based fluororesin is performed at a temperature of 5° C. for 24 hours.

20. The manufacturing method of claim 16, wherein the forming the CF-based fluororesin is performed at a temperature of 5° C., and
    wherein the drying the CF-based fluororesin is performed at a temperature of 5° C. for 24 hours.

* * * * *